United States Patent
Choi

(10) Patent No.: US 8,042,015 B2
(45) Date of Patent: Oct. 18, 2011

(54) HIGH-SPEED SEMICONDUCTOR MEMORY TEST DEVICE

(75) Inventor: Young-don Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 12/482,720

(22) Filed: Jun. 11, 2009

(65) Prior Publication Data

US 2010/0037108 A1 Feb. 11, 2010

(30) Foreign Application Priority Data

Aug. 11, 2008 (KR) .................. 10-2008-0078520

(51) Int. Cl.
*G11C 29/00* (2006.01)
*G01R 31/28* (2006.01)

(52) U.S. Cl. ......... 714/731; 714/718; 714/724; 714/744

(58) Field of Classification Search .................. None
See application file for complete search history.

(56) References Cited

U.S. PATENT DOCUMENTS

| 2004/0044491 | A1* | 3/2004 | Yonaga et al. | 702/118 |
| 2005/0246603 | A1* | 11/2005 | Rottacker et al. | 714/742 |
| 2008/0103719 | A1* | 5/2008 | Seong | 702/125 |
| 2009/0063913 | A1* | 3/2009 | Yamasaki et al. | 714/718 |

FOREIGN PATENT DOCUMENTS

| JP | 11038100 A | 2/1999 |
| KR | 1020010045334 A | 6/2001 |
| KR | 1020060085434 A | 7/2006 |

OTHER PUBLICATIONS

Yoshiyuki Nakamura ; Thomas Clouqueur ; Kewal K. Saluja ; Hideo Fujiwara ; Diagnosing At-Speed Scan BIST Circuits Using a Low Speed and Low Memory Tester, Issue Date : Nov. 2006—on p. 409—ISSN : 1081-7735—Print ISBN: 0-7695-2628-4 INSPEC Accession No. 9308646—Digital Object Identifier : 10.1109/ATS. 2006.260963.*

* cited by examiner

*Primary Examiner* — Jeffrey A Gaffin
*Assistant Examiner* — Guerrier Merant
(74) *Attorney, Agent, or Firm* — Volentine & Whitt, PLLC

(57) ABSTRACT

A semiconductor test device includes; a tester providing a first clock signal, first test data, a control signal and a first clock signal, a reference clock generating unit generating a reference clock signal, a clock converting unit receiving the reference clock signal and converting the frequency of the reference clock signal to a second clock signal in response to the control signal, and a test data converting unit receiving the first test data, converting the first test data to second test data synchronously with the second clock signal and providing the second test data to a semiconductor memory device under test.

16 Claims, 4 Drawing Sheets

FIG. 3

| DUT | #1 | #2 | #3 | #4 | #5 | #6 |
|---|---|---|---|---|---|---|
| FREQUENCY OF CLOCK SIGNAL [MHz] | 200 | 266 | 333 | 400 | 533 | 667 |
| FREQUENCY OF REFERENCE CLOCK SIGNAL [NHz] | 66.667 | 66.667 | 66.667 | 66.667 (133.333) | 66.667 (133.333) | 66.667 (133.333) |
| DIVISION FACTOR | 3 | 4 | 5 | 6 (3) | 8 (4) | 10 (5) |
| CLK_1 / CLK_2 [MHz] | 50/200 | 66.7/266 | 83.3/333 | 100/400 | 133.3/533 | 166.7/667 |
| TDATA_1 / TDATA_2 [MHz] | 100/400 | 133.3/533 | 166.7/667 | 200/800 | 266.7/1066 | 333.3/1333 |
| RDATA_1 / RDATA_2 [MHz] | 100/400 | 133.3/533 | 166.7/667 | 200/800 | 266.7/1066 | 333.3/1333 |

HIGH-SPEED SEMICONDUCTOR MEMORY TEST DEVICE

CROSS-REFERENCE TO RELATED APPLICATIONS

This application claims the benefit of Korean Patent Application No. 10-2008-0078520 filed on Aug. 11, 2008, the subject matter of which is hereby incorporated by reference.

BACKGROUND

The inventive concept relates to a semiconductor test device, and more particularly, to a semiconductor test device for testing a high-speed semiconductor memory device using a low-speed tester.

Many contemporary semiconductor memory devices are designed to operate at high speed. In particular, many of the clock signals used in such semiconductor memory devices are high-speed signals. Accordingly, in order to test high-speed semiconductor memory devices, semiconductor test devices capable of generating high-speed clock signals must be used. Unfortunately, high-speed semiconductor test devices are very expensive. Accordingly, there is a growing and unmet demand for test methods compatible with high-speed semiconductor memory devices, but which use an inexpensive low-speed tester.

SUMMARY

The inventive concept provides a semiconductor test method and device capable of efficiently testing a high-speed semiconductor memory device using a low-speed tester.

According to an aspect of the inventive concept, there is provided a semiconductor test device comprising; a tester providing a first clock signal and first test data, a reference clock generating unit generating a reference clock signal, a control unit generating a control signal in response to the first clock signal and the reference clock signal, a clock converting unit receiving the reference clock signal and converting the frequency of the reference clock signal to a second clock signal in response to the control signal, and a test data converting unit receiving the first test data, converting the first test data to second test data synchronously with the second clock signal and providing the second test data to a semiconductor memory device under test.

According to another aspect of the inventive concept, there is provided a semiconductor test device comprising; a tester providing a first clock signal, first test data, a control signal and a first clock signal, a reference clock generating unit generating a reference clock signal, a clock converting unit receiving the reference clock signal and converting the frequency of the reference clock signal to a second clock signal in response to the control signal, and a test data converting unit receiving the first test data, converting the first test data to second test data synchronously with the second clock signal and providing the second test data to a semiconductor memory device under test.

BRIEF DESCRIPTION OF THE DRAWINGS

Embodiments of the inventive concept will be more clearly understood from the following detailed description taken in conjunction with the accompanying drawings in which:

FIG. 3 is a table showing a set of exemplary frequencies for various signals associated with the semiconductor memory device of FIG. 1.

DESCRIPTION OF EMBODIMENTS

Embodiments of the inventive concept will now be described with reference to the accompanying drawings. However, the inventive concept may be variously embodied and should not be construed as being limited to only the illustrated embodiments. Rather, the illustrated embodiments are presented as teaching examples. Throughout the drawings and written description, like reference numbers and legends are used to indicate like or similar elements, signals, and features.

Figure 1:
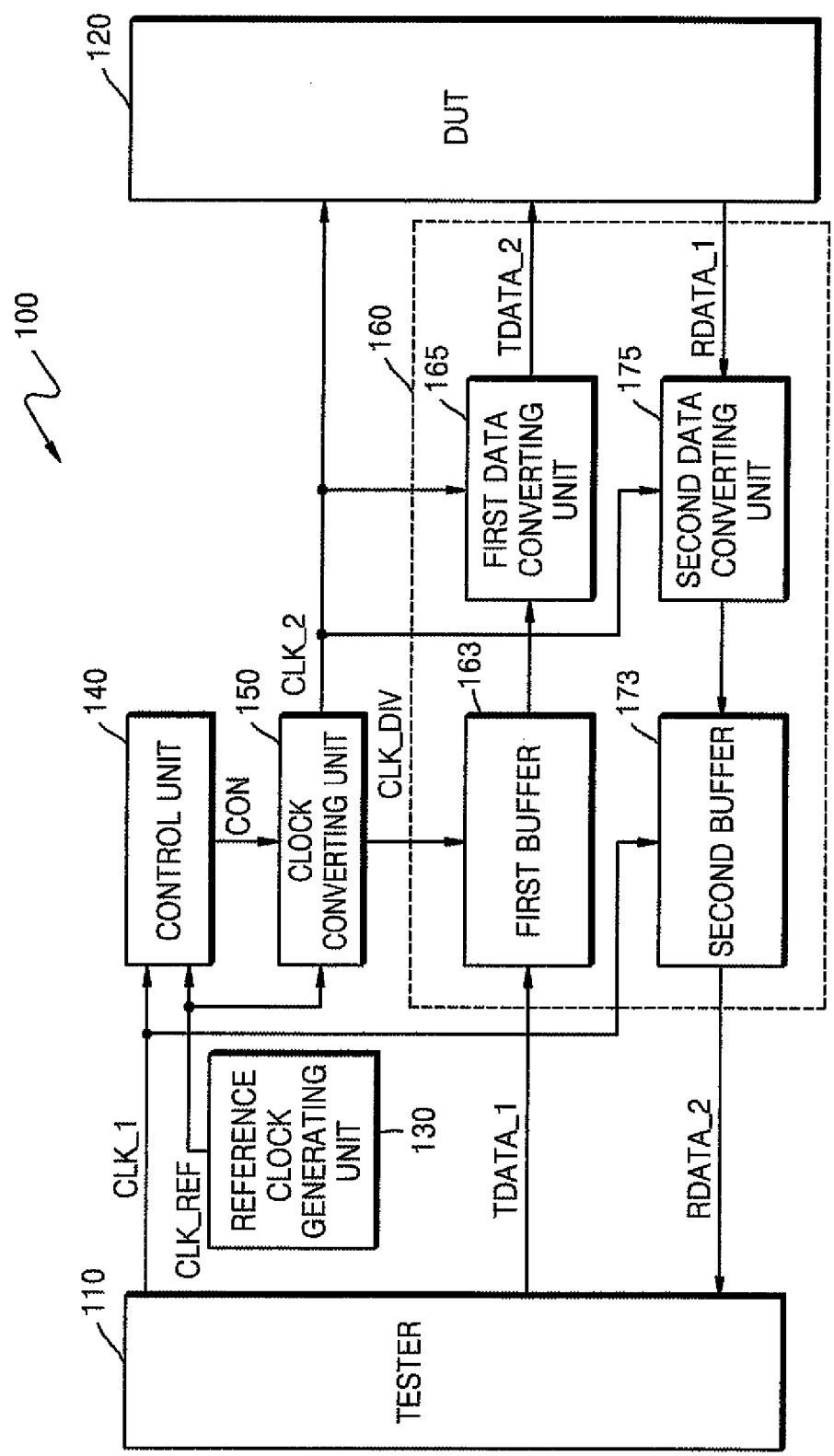
FIG. 1 is a block diagram of a semiconductor test device according to an embodiment of the inventive concept.

FIG. 1 is a block diagram of a semiconductor test device 100 according to an embodiment of the inventive concept.

Referring to FIG. 1, the semiconductor test device 100 generally comprises a tester 110, a reference clock generating unit 130, a control unit 140, a clock converting unit 150, and a test data converting unit 160. The tester 110 may be a low-speed tester, and the particular semiconductor memory device under test (DUT) 120 may be a high-speed semiconductor memory device. Those skilled in the art will recognize that the terms "high-speed" and "low-speed" are relative in nature and may be understood as relating, at least in one aspect, to the operating (clocking) frequency of the respective devices.

Hence, the tester 1 10 outputs a relatively low frequency, first clock signal CLK_1, while the semiconductor test device ultimately outputs a first test data TDATA_1 compatible with the high-speed DUT.

In the illustrated embodiment, the reference clock generating unit 130 generates a reference clock signal CLK_REF having a jitter component that is less than that of the first clock signal CLK_1. In one specific embodiment, the reference clock generating unit 130 may be a crystal oscillator. However, the reference clock generating unit 130 is not limited to the crystal oscillator, but may be any device capable of generating a clock signal having a jitter component less than that associated with the first clock signal CLK_1.

The control unit 140 generates a control signal CON in response to the first clock signal CLK_1 and the reference clock signal CLK_REF.

The clock converting unit 150 receives the reference clock signal CLK_REF, converts a frequency of the reference clock signal CLK_REF to a second clock signal CLK_2 in response to the control signal CON, and outputs the second clock signal CLK_2. In the illustrated embodiment, the second clock signal CLK_2 is assumed to have a frequency higher than that of the first clock signal CLK_1. The clock converting unit 150 converts the second clock signal CLK_2 into a divided clock signal CLK_DIV having the same frequency as the reference clock signal CLK_REF, and then outputs the divided clock signal CLK_DIV. In certain embodiments, the clock converting unit 150 may be implemented using a phase locked loop (PLL) or a delay locked loop (DLL). However, the clock converting unit 150 is not limited PLL and/or DLL implementations. Any circuit capable of converting the frequency of the reference clock signal CLK-REF in response to the control signal CON may be used.

Assuming, however, that the clock converting unit 150 includes a PLL, as a jitter component of an input clock signal of the PLL decreases, the jitter component associated with an output clock signal of the PLL also decreases. If the clock converting unit 150 includes the DLL, as a jitter component of an input clock signal of the DLL decreases, the jitter component associated with an output clock signal of the DLL also decreases.

Accordingly, unlike many conventional semiconductor test devices in which a corresponding first clock signal CLK_1 is applied to a corresponding clock converting unit 150 as an input signal, the semiconductor test device 100 of FIG. 1 instead uses the reference clock signal CLK_REF having a jitter component that is less than that of the first clock signal CLK_1 as an input signal to the clock converting unit 150. As a result, the jitter component associated with the second clock signal CLK_2 is less than that generally provided by conventional semiconductor test devices.

The operation of the control unit 140 and the clock converting unit 150 will be explained in some additional detail with reference to FIG. 3.

The test data converting unit 160 receives the first test data TDATA_1, converts the first test data TDATA_1 to second test data TDATA_2 that is synchronized with the second clock signal CLK_2, and outputs the second test data TDATA_2. The test data converting unit 160 may also be configured to receive first read data RDATA_1 provided by the semiconductor memory DUT 120 in response to the second test data TDATA_2. The first read data RDATA_1 is converted into second read data RDATA_2 that is synchronized with the first clock signal CLK_1. Thereafter, the second read data RDATA_2 may be output to the tester 110.

In the illustrated embodiment of FIG. 1, the test data converting unit 160 include a first buffer 163, a first data converting unit 165, a second buffer 173, and a second data converting unit 175.

The first buffer 163 buffers and outputs the first test data TDATA_1 in relation to (e.g., synchronously with) the divided clock signal CLK_DIV. The divided clock signal CLK_DIV is a clock signal obtained, for example, by converting the frequency of the reference clock signal CLK_REF. In the illustrated embodiment, the tester 110 outputs the first test data TDATA_1 synchronously with the first clock signal CLK_1. Hence, the first buffer 163 converts the first test data TDATA_1 from a first clock signal CLK_1 domain to a reference clock signal CLK_REF domain.

The first data converting unit 165 converts the output of the first buffer 163 into the second test data TDATA_2 in relation to (e.g., synchronously with) the second clock signal CLK_2 and outputs the second test data TDATA_2. Accordingly, the second test data TDATA_2 is synchronized with the second clock signal CLK_2 before being applied to (e.g., written or programmed to) the semiconductor memory DUT 120.

In response to the second test data TDATA_2, the semiconductor memory DUT 120 may return (e.g., via a read data operation) the second read data RDATA_2. The second data converting unit 175 converts the second read data RDATA_2 into data synchronized with the first clock signal CLK_1. That is, the second data converting unit 175 performs the opposite operation of that performed by the first data converting unit 165.

The second buffer 173 buffers and outputs a first read data signal RDATA_1 in response to the output of the second data converting unit 175 in relation to the first clock signal CLK_1. In the illustrated embodiment, the second clock signal CLK_2 is a clock signal obtained by converting the frequency of the reference clock signal CLK_REF. The second read data RDATA_2 is thus synchronized with the second clock signal CLK_2. Hence, the second buffer 173 converts the second read data RDATA_2 from the reference clock domain to the first clock domain. With this configuration, the tester 110 is able to test the semiconductor memory DUT 120 by comparing, for example, the first test data TDATA_1 written to the semiconductor memory DUT 120 with the corresponding first read data RDATA_1 stored in the second buffer 173.

Figure 2:
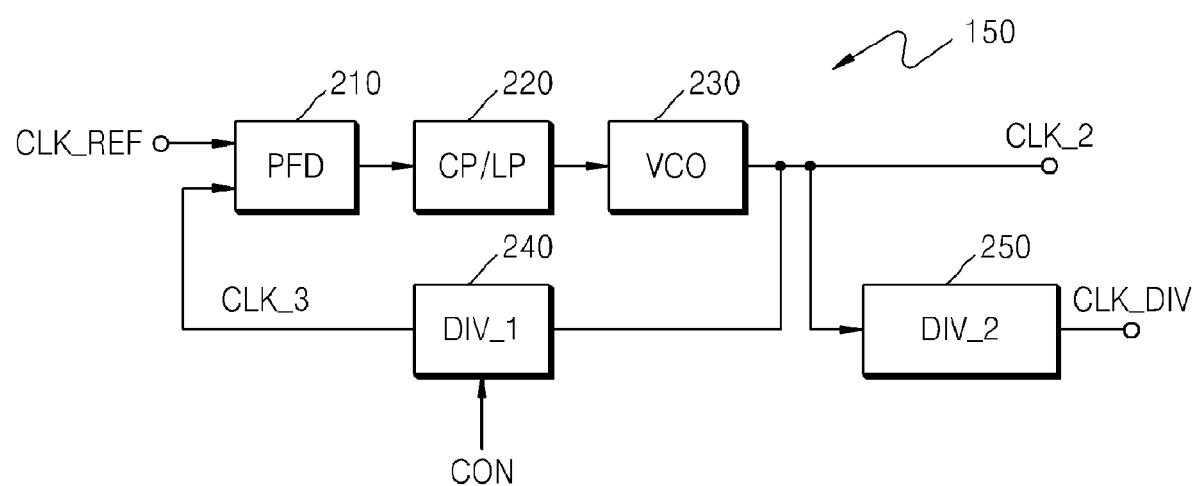
FIG. 2 is a block diagram further illustrating the clock converting unit of the semiconductor test device of FIG. 1.

FIG. 2 is a block diagram further illustrating the clock converting unit 150 of the semiconductor test device 100 of FIG. 1.

In FIG.2, it is assumed that the clock converting unit 150 includes the PLL. However, the inventive concept is not limited thereto as described above.

Referring to FIGS. 1 and 2, the clock converting unit 150 comprises a phase frequency detector (PFD) 210, a charge pump/loop filter (CP/LP) 220, a voltage controlled oscillator (VCO) 230, a first divider DIV_1 240, and a second divider DIV_2 250.

The PFD 210 detects a phase difference and a frequency difference by comparing the reference clock signal CLK_REF with a third clock signal CLK_3. The CP/LP 220 outputs a control voltage signal in response to an output signal of the PFD 210. The VCO 230 outputs the second clock signal CLK_2 in response to the control voltage signal provided by CP/LP 220. The first divider DIV_1 240 divides the second clock signal CLK_2 to the third clock signal CLK_3 in response to the control signal CON provided by the control unit 140 and outputs the third clock signal CLK_3. The first divider DIV_1 240 may change a constituent division factor in response to the control signal CON. The second divider DIV_2 250 divides the second clock signal CLK_2 to a divided clock signal CLK_DIV having the same frequency as the reference clock signal CLK_REF and outputs the divided clock signal CLK_DIV. The operation of the clock converting unit 150 will be explained in some additional detail with reference to FIG. 3.

FIG. 3 is a table showing exemplary frequencies for some of the signals described above in relation to the embodiment of FIG. 1.

The operation of the semiconductor test device 100 will now be further explained with reference to FIGS. 1 through 3. It is assumed for purposes of illustration that the frequency of a second clock signal CLK_2 is four (4X) times higher than that of the first clock signal CLK_1. That is, data is read from or written to the semiconductor memory DUT 120 by using the second clock signal CLK_2 having a frequency that is four (4×) times higher than that of the first clock signal CLK-1 provided by the tester 110. However, embodiments of the inventive concept are not limited to this relationship.

For example, it is assumed that the semiconductor test device 100 is operated to test first through sixth semiconductor memory DUTs (#1, #2, #3, #4, #5, and #6). As shown in FIG. 3, the frequency of the second clock signal CLK_2 associated with the first semiconductor memory DUT #1 is 200 MHZ, and the tester 110 outputs a first clock signal CLK_1 having a frequency of 50 MHz. The frequency of the second clock signal CLK_2 associated with the second semiconductor memory DUT #2 is 266 MHz, and the tester 110 outputs a first clock signal CLK_1 having a frequency of 66.667 MHz. That is, the first through sixth semiconductor memory DUTs #1, #2, #3, #4, #5, and #6 are tested by using respective second clock signals CLK_2, each having a frequency that is four (4×) times higher than that of a first clock signal CLK_1 provided by the tester 110.

The reference clock generating unit 130 generates the reference clock signal CLK_REF having a frequency that is 1/N of a frequency used by the semiconductor memory DUT 120. If the first through sixth semiconductor memory DUTs #1,

2, #3, #4, #5, and #6 of FIG. 3 are tested, a frequency that is 1/N of the frequency of each of the second clock signals CLK_2 of the first through sixth semiconductor memory DUTs #1, #2, #3, #4, #5, and #6 is 66.667 MHz. Accordingly, the reference clock generating unit 130 generates the reference clock signal CLK_REF having a frequency of 66.667 MHz. For example, if the fourth through sixth semiconductor memory DUTs #4, #5, and #6 are tested, a reference clock signal CLK_REF may have a frequency of 66.667 or 133.333 MHz that is 1/N of a frequency of each of the fourth through sixth semiconductor memory devices DUTs #4, #5, and #6.

A case where the first semiconductor memory device DUT #1 is tested after a frequency of a reference clock signal CLK_REF is set to 66.667 MHz will now be explained. The control unit 140 receives the first clock signal CLK_1 and the reference clock signal CLK_REF, and generates the control signal CON defining the frequency division factor for the first divider DIV_1 240. That is, since the first clock signal CLK_1 has a frequency of 50 MHZ and the reference clock signal CLK_REF has a frequency of 66.667 MHz, the control unit 140 generates and outputs a control signal CON that sets the division factor of the first divider DIV_1 240 to three (3) in response to the control signal CON. Hence, the clock converting unit 150 output a second clock signal CLK_2 having a frequency of 200 MHz. That is, the clock converting unit 150 increases the frequency of the second clock signal CLK_2 until a third clock signal CLK_3 has a frequency of 66.667 MHz, and once the second clock signal CLK_2 has a frequency of 200 MHz, the third clock signal CLK_3 has a frequency of 66.667 MHz and thus the frequency of the second clock signal CLK_2 is no longer increased.

In FIG. 3, the division factor of the second divider DIV_2 250 is four (4). Since the second clock signal CLK_2 has a frequency that is four times (4×) higher than that of the first clock signal CLK_1, the second divider DIV_2 250 outputs a divided the clock signal CLK_DIV having a frequency that is a quarter (¼) of that of the second clock signal CLK_2. For example, if the first semiconductor memory DUT #1 is tested, since the second clock signal CLk_2 has a frequency of 200 MHz, the divided clock signal CLK_DIV has a frequency of 50 MHz. That is, although the divided clock signal CLK_DIV and the first clock signal CLK_1 have the same frequency, since the reference clock signal CLK_REF has a jitter component that is less than that of the first clock signal CLK_1, the divided clock signal CLK_DIV has a jitter component that is less than that of the first clock signal CLK_1.

Since the second through sixth semiconductor memory DUTs #2, #3, #4, #5, and #6 are tested in a similar manner to that performed when the first semiconductor memory DUT #1 is tested, a detailed explanation thereof will not be given. However, if the fourth through sixth semiconductor memory DUTs #4, #5, and #6 are tested and the reference clock signal CLK_REF has a frequency of 66.667 MHz, a division factor of the first divider DIV_1 240 may be 6, 8, and 10, respectively, whereas if the fourth through sixth semiconductor memory DUTs #4, #5, and #6 are tested and the reference clock signal CLK_REF has a frequency of 133.333 MHz, a division factor of the first divider DIV_1 240 may be 3, 4, and 5, respectively.

Figure 4:
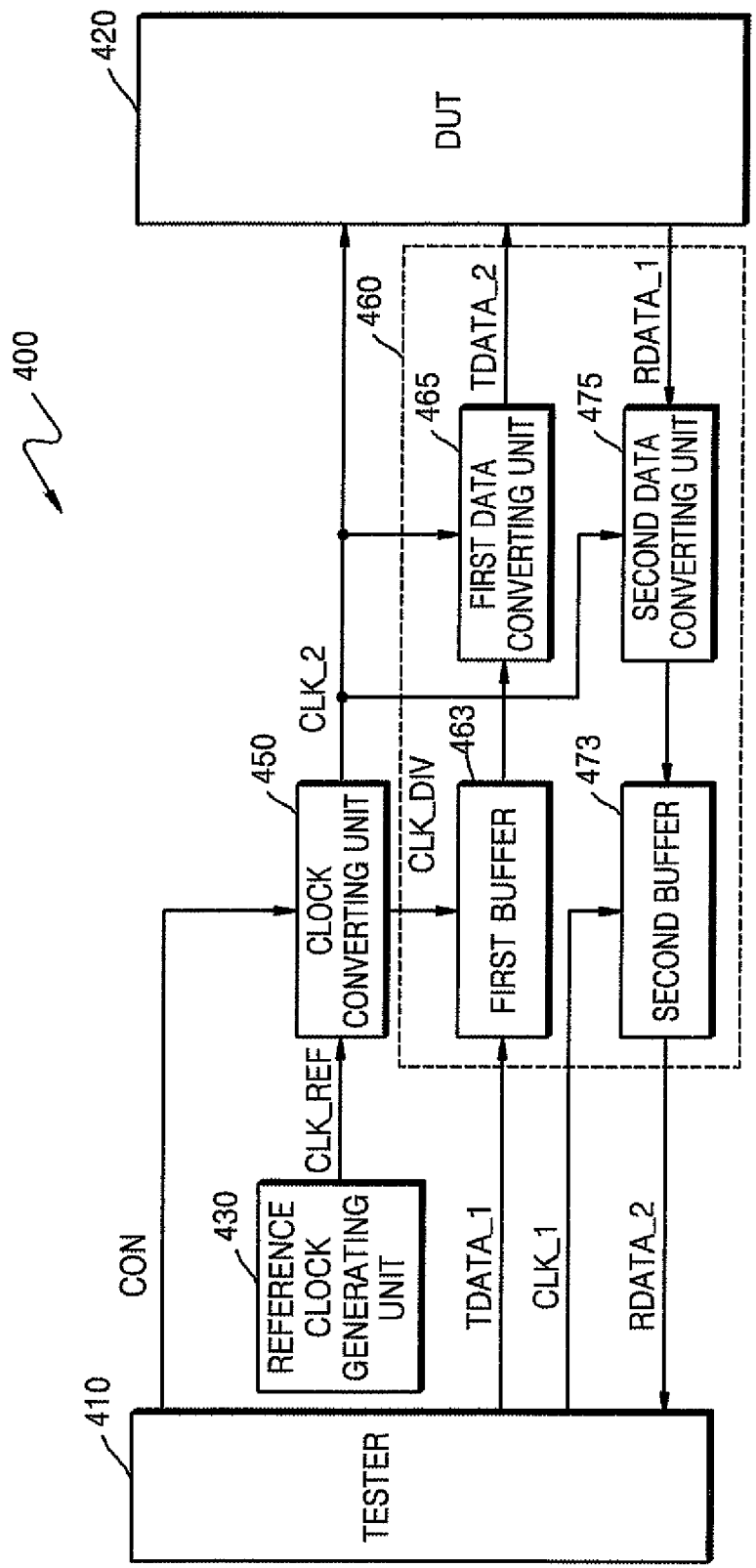
FIG. 4 is a block diagram of a semiconductor test device according to another embodiment of the inventive concept.

FIG. 4 is a block diagram further illustrating a semiconductor test device 400 according to another embodiment of the inventive concept.

Comparing the embodiments of FIGS. 1 and 4, a reference clock generating unit 430, a clock converting unit 450, and a test data converting unit 460 of FIG. 4 respectively perform the same operations as those of the reference clock generating unit 130, the clock converting unit 150, and the test data converting unit 160 of FIG. 1, and thus an explanation thereof will not be given. The clock converting unit 450 may again include a PLL or a DLL as described above with reference to FIG. 2.

In FIG. 4, the semiconductor test device 400 does not include an element corresponding to the control unit 140 of FIG. 1. Instead, a tester 410 generates a control signal CON and provides the control signal CON to the clock converting unit 450. For example, if the clock converting unit 450 is configured as shown in FIG. 2, the tester 410 generates and outputs a control signal CON corresponding to a division factor of a first divider DIV_1 440 (not shown). Accordingly, the semiconductor test device 400 of FIG. 4 does not need an additional element corresponding to the control unit 140 of FIG. 1.

A semiconductor test device according to the inventive concept is capable of testing a high-speed semiconductor memory device using a high frequency clock signal having reduced jitter which is obtained by converting a clock signal provided by a constituent low-speed tester.

While the inventive concept has been particularly shown and described with reference to exemplary embodiments thereof using specific terms, the embodiments and terms have been used to explain the inventive concept and should not be construed as limiting the scope of the inventive concept defined by the claims. The exemplary embodiments should be considered in a descriptive sense only and not for purposes of limitation. Therefore, the scope of the inventive concept is defined not by the detailed description of the inventive concept but by the appended claims, and all differences within the scope will be construed as being included in the inventive concept.

What is claimed is:

1. A semiconductor test device configured to test a semiconductor device under test (DUT), and comprising:
    a tester providing a first clock signal having a first jitter component and first test data;
    a reference clock generating unit generating a reference clock signal having a second jitter component less than the first jitter component;
    a control unit generating a control signal in response to the first clock signal and the reference clock signal;
    a clock converting unit receiving the reference clock signal and converting the frequency of the reference clock signal to generate a second clock signal having a frequency higher than that of the first clock signal in response to the control signal; and
    a test data converting unit receiving the first test data, converting the first test data to second test data synchronously with the second clock signal and providing the second test data to the DUT.

2. The semiconductor test device of claim 1, wherein the clock converting unit comprises:
    a divider dividing the second clock signal to a divided clock signal having the same frequency as that of the first clock signal and providing the divided clock signal.

3. The semiconductor test device of claim 2, wherein the test data converting unit comprises:
    a first buffer receiving and buffering the first test data in response to the divided clock signal; and
    a first data converting unit converting the first test data provided by the first buffer into second test data synchronous with the second clock signal, and providing the second test data to the DUT.

4. The semiconductor test device of claim 3, wherein the test data converting unit further comprises:

a second data converting unit receiving first read data provided by the DUT synchronously with the second clock signal, and converting the first read data to second read data synchronously with the first clock signal; and
a second buffer receiving and buffering the second read data from the second data converting unit and providing the second read data to the tester.

5. A semiconductor test device comprising:
a tester providing a first clock signal having a first jitter component, first test data, and a control signal;
a reference clock generating unit generating a reference clock signal having a second jitter component less than the first jitter component;
a clock converting unit receiving the reference clock signal and the control signal, and converting the frequency of the reference clock signal to a second clock signal having a frequency higher than that of the first clock signal in response to the control signal; and
a test data converting unit receiving the first test data, converting the first test data to second test data synchronously with the second clock signal and providing the second test data to a semiconductor memory device under test.

6. The semiconductor test device of claim 5, wherein the clock converting unit comprises:
a divider dividing the second clock signal to a divided clock signal having the same frequency as that of the first clock signal and providing the divided clock signal.

7. The semiconductor test device of claim 6, wherein the test data converting unit comprises:
a first buffer receiving and buffering the first test data in response to the divided clock signal; and
a first data converting unit converting the first test data provided by the first buffer into second test data synchronously with the second clock signal, and providing the second test data to the semiconductor memory device under test.

8. The semiconductor test device of claim 7, wherein the test data converting unit further comprises:
a second data converting unit receiving first read data provided by the semiconductor memory device under test synchronously with the second clock signal, and converting the first read data to second read data synchronously with the first clock signal; and
a second buffer receiving and buffering the second read data from the second data converting unit and providing the second read data to the tester.

9. The semiconductor test device of claim 5, wherein the clock converting unit receives only the reference clock signal and the control signal.

10. The semiconductor test device of claim 5, wherein the reference clock generating unit, the clock converting unit, and the test data converting unit are respectively disposed external to the DUT.

11. The semiconductor test device of claim 1, wherein the clock converting unit receives only the reference clock signal and the control signal.

12. The semiconductor test device of claim 1, wherein the reference clock generating unit, the control unit, the clock converting unit, and the test data converting unit are respectively disposed external to the DUT.

13. A semiconductor test device, comprising:
a tester that provides a first clock signal having a first frequency and first test data;
a reference clock generating unit that generates a reference clock signal;
a control unit that generates a control signal in response to the first clock signal and the reference clock signal;
a clock converting unit that receives the reference clock signal, converts the frequency of the reference clock signal to generate a second clock signal having a frequency higher than the first frequency in response to the control signal, and comprises a divider that divides the second clock signal to a divided clock signal having the first frequency; and
a test data converting unit that receives the first test data, converts the first test data to second test data synchronously with the second clock signal, provides the second test data to a semiconductor memory device under test (DUT), and comprises;
a first buffer that receives and buffers the first test data in response to the divided clock signal; and
a first data converting unit that converts the first test data provided by the first buffer into second test data synchronous with the second clock signal, and provides the second test data to the DUT.

14. The semiconductor test device of claim 13, wherein the test data converting unit further comprises:
a second data converting unit that receives first read data provided by the DUT synchronously with the second clock signal, and converts the first read data to second read data synchronously with the first clock signal; and
a second buffer that receives and buffers the second read data from the second data converting unit and provides the second read data to the tester.

15. A semiconductor test device comprising:
a tester that provides a first clock signal having a first frequency, first test data, and a control signal;
a reference clock generating unit that generates a reference clock signal;
a clock converting unit that receives the reference clock signal and the control signal, converts the frequency of the reference clock signal to generate a second clock signal having a frequency higher than the first frequency in response to the control signal, and comprises a divider that divides the second clock signal to a divided clock signal having the first frequency and provides the divided clock signal; and
a test data converting unit that receives the first test data, converts the first test data to second test data synchronously with the second clock signal, provides the second test data to a semiconductor memory device under test (DUT), and comprises:
a first buffer that receives and buffers the first test data in response to the divided clock signal; and
a first data converting unit that converts the first test data provided by the first buffer into second test data synchronously with the second clock signal and provides the second test data to the DUT.

16. The semiconductor test device of claim 15, wherein the test data converting unit further comprises:
a second data converting unit that receives first read data provided by the DUT synchronously with the second clock signal, and converts the first read data to second read data synchronously with the first clock signal; and
a second buffer that receives and buffers the second read data from the second data converting unit and provides the second read data to the tester.

* * * * *